US006862162B2

United States Patent
Casey (10) Patent No.: US 6,862,162 B2
(45) Date of Patent: Mar. 1, 2005

(54) THYRISTOR CIRCUIT PROVIDING OVERCURRENT PROTECTION TO A LOW IMPEDANCE LOAD

(75) Inventor: Kelly C. Casey, Flower Mound, TX (US)

(73) Assignee: TECCOR Electronics, LP, Irving, TX (US)

( * ) Notice: Subject to any disclaimer, the term of this patent is extended or adjusted under 35 U.S.C. 154(b) by 22 days.

(21) Appl. No.: 10/421,245

(22) Filed: Apr. 23, 2003

(65) Prior Publication Data

US 2004/0212939 A1 Oct. 28, 2004

(51) Int. Cl.[7] .............................................. H02H 3/20
(52) U.S. Cl. ...................................... 361/91.1; 361/35
(58) Field of Search .......................... 361/91.1, 35, 38, 361/54, 58, 88, 93.1

(56) References Cited

U.S. PATENT DOCUMENTS

| | | |
|---|---|---|
| 3,968,511 A | 7/1976 | Yagi et al. |
| 3,978,514 A | 8/1976 | Ogawa et al. |
| 3,982,268 A | 9/1976 | Anthony et al. |
| 4,275,410 A | 6/1981 | Grinberg et al. |
| 4,282,555 A | 8/1981 | Svedberg |
| 4,363,064 A | 12/1982 | Billings et al. |
| 4,456,940 A | 6/1984 | Hammerberg et al. |
| 4,570,173 A | 2/1986 | Anthony et al. |
| 4,577,255 A | 3/1986 | Martin |
| 4,589,190 A | 5/1986 | Anthony |
| 4,660,063 A | 4/1987 | Anthony |
| 4,914,045 A | 4/1990 | Webb et al. |
| 5,195,130 A | 3/1993 | Weiss et al. |
| 5,424,245 A | 6/1995 | Gurtler et al. |
| 5,479,031 A | 12/1995 | Webb et al. |
| 5,539,820 A | 7/1996 | Pistilli |
| 5,546,038 A * | 8/1996 | Croft .......................... 327/310 |
| 5,625,519 A | 4/1997 | Atkins |
| 5,652,575 A | 7/1997 | Pryor et al. |
| 5,657,195 A | 8/1997 | Rault |
| 5,682,062 A | 10/1997 | Gaul |
| 5,696,391 A * | 12/1997 | Bernier ....................... 257/146 |
| 5,742,098 A | 4/1998 | Brunner |
| 5,828,089 A | 10/1998 | Bernier |
| 5,953,194 A | 9/1999 | Atkins |
| 6,298,134 B1 | 10/2001 | Curry |
| 6,407,901 B1 | 6/2002 | Casey et al. |
| 6,448,589 B1 | 9/2002 | Casey et al. |

FOREIGN PATENT DOCUMENTS

EP          472 405 A2        2/1990

* cited by examiner

*Primary Examiner*—Stephen W. Jackson
*Assistant Examiner*—James A Demakis
(74) *Attorney, Agent, or Firm*—Chauza & Handley, LLP; Roger N. Chauza (57) ABSTRACT

A thyristor provides overcurrent protection to a low impedance load, such as a transformer, by adding a resistance in series with the transformer winding. As overcurrents attempt to pass through the transformer winding, a sufficient voltage is generated in the transformer so that a thyristor connected thereacross is triggered into conduction. A resistance formed between the thyristor gate and cathode establishes the threshold of current that can pass through the transformer winding before the thyristor is triggered. When triggered into conduction, the thyristor shunts the current and the transformer is thus protected.

26 Claims, 4 Drawing Sheets

THYRISTOR CIRCUIT PROVIDING OVERCURRENT PROTECTION TO A LOW IMPEDANCE LOAD

RELATED APPLICATIONS

This patent application relates to U.S. application Ser. No. 09/436,114, filed Nov. 8, 1999, now U.S. Pat. No. 6,407,901, entitled "SEMICONDUCTOR DEVICE PROVIDING OVERVOLTAGE AND OVERCURRENT PROTECTION FOR A LINE", and relates to U.S. application Ser. No. 09/575,861, filed May 19, 2000, entitled "SINGLE SIDE CONTACTS FOR A SEMICONDUCTOR DEVICE," the disclosures of which are incorporated herein by reference.

TECHNICAL FIELD OF THE INVENTION

The present invention relates in general to overcurrent protection circuits, and in particular relates to circuits for protecting low impedance loads with gated thyristor devices.

BACKGROUND OF THE INVENTION

Semiconductor devices have found a myriad of applications in every electrical circuit produced for consumer, commercial, industrial and military uses. Semiconductor devices, like many other electrical components, are susceptible to damage or destruction when exposed to excessive currents and voltages. When the need arises, circuits can be designed to provide protection to the devices that may encounter the overcurrents and overvoltages. Generally, as the sophistication of the protection circuits increase, the expense and reliability are adversely affected.

Depending on the magnitude of current that may have to be accommodated during an overcurrent situation, different protection devices can by employed. If small currents, in the range of 0.5 amp or less, are involved, then conventional bipolar transistor or field effect transistor (FET) circuits can be utilized to shunt the overcurrent away from the circuit to be protected. For larger currents, power thyristors can be used as the device for shunting the overcurrent away from the circuit to be protected. Thyristor devices, such as silicon controlled rectifiers (SCRs), can be used for carrying DC currents, and triacs can be used for carrying AC currents. Gated thyristors constitute a family of devices that have at least three terminals, which are sometimes called a cathode terminal, an anode terminal, and a gate terminal. The gate terminal is used for driving the device into conduction when appropriately energized. Some thyristor devices, such SIDACtor® overvoltage protection devices, employ only an anode and a cathode terminal. These two-terminal devices are generally used to protect circuits from overvoltages. A family of overvoltage protection SIDACtor® devices providing overvoltage protection is available from Teccor Electronics, Irving, Tex.

Thyristors are often used as the device to carry the overcurrent, because the associated sensing circuit are of a very fundamental nature. For example, the anode and cathode terminals can be connected between ground and the conductor carrying circuit current. The gate terminal can be connected to a resistor circuit which senses the circuit current. The value of the resistor generally sets the threshold of current carried by the circuit before the thyristor is gated into conduction to shunt the overcurrent from the conductor to ground.

The prior art is replete with teachings of the use of thyristors for protecting circuits from overvoltages and overcurrents. U.S. Pat. No. 5,625,519 discloses the use of a triac-type of thyristor in a shunt switching circuit to shunt the overcurrent around the load. U.S. Pat. No. 5,657,195 discloses the use of a gated turn-off (GTO) thyristor in series with the load. When the GTO thyristor is placed in a blocking state, the thyristor prevents current from reaching the load. U.S. Pat. No. 5,652,575 teaches the use of a triac connected across two lines to prevent an overvoltage on the lines from affecting the other circuits.

Thyristor devices, especially SCRs and triacs, are constructed as multiple-layer regenerative semiconductor devices. Such type of devices can be driven into an initial state of conduction, and if the external circuits connected thereto allow the appropriate voltage conditions across the thyristor, such devices can be driven into a latched state where the device is in full conduction and the voltage across the anode and cathode is on the order of a volt or so. When a thyristor is driven into the latched state, the device remains in full conduction even in the absence of the gating signal. The thyristor devices remain in the latched state until the anode-cathode current falls below a specified holding current ($I_h$). The latched state of a gated thyristor depends not only on the extent of the gating signal, but also on the magnitude of voltage between the anode and gate. This latter parameter is generally of little or no concern, as the load to be protected usually has a sufficient resistance or impedance. However, in those circuit configurations where the load has very little impedance, the gated thyristor may not be able to be latched, even though a large overcurrent exists and the gate-cathode junction of the device is forward biased. Should this adverse situation occur, the overcurrent will continue to pass through the load and the gate-cathode junction of the thyristor, but the thyristor will not be in a very low impedance latched state to otherwise shunt the overcurrent around the load. Hence, the use of gated thyristors to provide overcurrent protection to low impedance loads has not been practical.

SUMMARY OF THE INVENTION

In accordance with the principles and concepts of the invention, there is disclosed a thyristor circuit and corresponding device that overcomes the shortcomings and problems attendant with the prior art. In accordance with an important aspect of the invention, disclosed is a thyristor circuit that is bridged across a low impedance load to protect the load from overcurrents. An additional small impedance is connected in series with the load to increase the overall impedance thereof so that the thyristor can be reliably latched in a conductive state in response to a threshold current passing through the load.

In accordance with one embodiment of the invention, a loading resistor is placed in series with a transformer which forms the load of the circuit. The anode and gate terminals of a gated thyristor are bridged across the loading resistor and transformer, whereby when a threshold current passes through the transformer and loading resistor, the thyristor is gated into conduction so that the overcurrent is shunted away from the load.

In accordance with another feature of the invention, the loading resistor is integrated in the semiconductor material with the thyristor device.

In accordance with another aspect of the invention, the thyristor device incorporates a resistive semiconductor path formed between the gate region and the cathode region, where the value of such resistive path defines the threshold of current for triggering the thyristor device into conduction.

In accordance with yet another feature of the invention, the loading resistance formed in the semiconductor device which is in series with the load, also functions as a resistive pillar from one surface of the thyristor chip to the opposite surface.

With regard to yet another feature of the invention, there is disclosed a thyristor circuit for use with a low impedance load, comprising a gated thyristor having an anode, cathode and a gate; a low impedance load; a series impedance connected in series with the low impedance load; the anode and gate of the gated thyristor is connected in parallel across both the low impedance load and the series impedance; and the anode and cathode constitute terminals for the thyristor circuit, whereby when a current exceeding a predefined magnitude passes through the low impedance load, the thyristor is gated on and current is shunted around the low impedance load.

Another feature according to the invention includes a thyristor circuit for use with a transformer load, which comprises a first resistor connected in series with the transformer load to provide an additional resistance external to the transformer load; a gated thyristor having an anode, cathode and gate; the anode and gate are connected in parallel across the first resistor and transformer load; a second resistor is connected between the gate and cathode of the gated thyristor, the second resistor functioning to establish an overcurrent threshold for the gated thyristor, whereby the gated thyristor is triggered into conduction when the overcurrent threshold is exceeded to thereby prevent the overcurrent from passing through the transformer load.

According to a further feature of the invention, there is provided a thyristor circuit for use with a transformer defining a load, where the transformer is packaged as a modular component and has a first winding inductively coupled to a second winding; also included is a first resistor connected in series with the first winding of the transformer to provide an additional resistance to the first winding, and the first resistor is packaged with the transformer so as to be a unitary modular component; included also is a gated thyristor having an anode, cathode and gate, where the anode and gate are adapted for connection in parallel across the first resistor and the first winding; and a second resistor connected between the gate and cathode of the gated thyristor, the second resistor functions to establish an overcurrent threshold for the thyristor circuit, whereby the gated thyristor is triggered into conduction when the overcurrent threshold is exceeded to thereby prevent the overcurrent from passing through the transformer load.

According to a method of the invention, there is provided a method of using a gated to protect a low impedance load from overcurrent conditions. The method includes the coupling an anode terminal and a gate terminal of a gated thyristor across the low impedance load, adding a resistance in series with the low impedance load to increase a composite impedance thereof, causing the gated thyristor to be driven to a latched state when a current exceeding a threshold attempts to pass through the low impedance load; and causing the current exceeding the threshold to be coupled through the gated thyristor between the anode terminal and a cathode terminal of the gated thyristor, thereby routing the current around the low impedance load.

BRIEF DESCRIPTION OF THE DRAWINGS

Further features and advantages will become apparent from the following and more particular description of the preferred and other embodiments of the invention, as illustrated in the accompanying drawings in which like reference characters generally refer to the same parts, functions or elements throughout the views, and in which.

DETAILED DESCRIPTION OF THE INVENTION

Figure 1A:
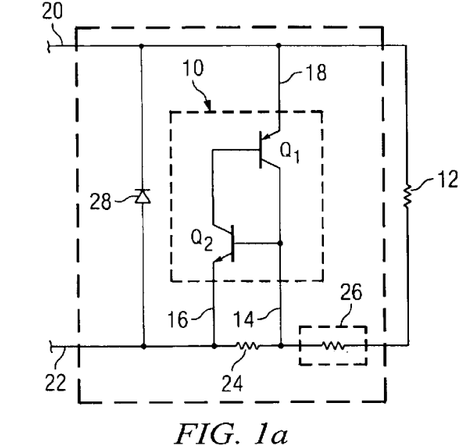
FIG. 1a is an electrical schematic drawing of a thyristor circuit according to one embodiment of the invention.

With reference to FIG. 1a, there is shown a gated thyristor circuit employed for protecting a low impedance load from damage due to excessive currents. In the arrangement shown, the thyristor 10 is connected in parallel across the load 12. The thyristor 10 comprises an SCR and the load comprises a small value resistor 12. An SCR 10 is illustrated to describe the features of the invention, it being realized that in AC circuits a triac could be the type of device used to protect the load 12 from overcurrents of either polarity. Those skilled in the art realize that an SCR is a four-layer pnpn device frequently modeled as a pnp transistor and an npn transistor arranged as shown. A triac is similarly constructed as a five-layer npnpn device. The structure and operation of a triac can be considered as two pnpn SCR devices of opposite orientation formed in the same chip, with a single common gate terminal.

The pnp portion of the four layer SCR 10 is the transistor Q1, and the npn portion of the SCR 10 is the transistor Q2. The middle pn layers of the four-layer device are semiconductor regions shared between the bases and collectors of the transistors Q1 and Q2. The transistors Q1 and Q2 are connected together in the semiconductor chip, as shown, so that a regenerative effect occurs when the device is triggered into operation. The SCR 10 includes a gate terminal 14, a cathode terminal 16 and an anode terminal 18. The anode terminal 18 is connected to a circuit conductor 20 which is coupled to one terminal of the load 12. The cathode terminal 16 of the SCR 10 is connected to a circuit conductor 22. A bias resistor 24 is either connected or formed between the gate terminal 14 and the cathode terminal 16. The value of the bias resistor 24 functions to establish the threshold of overcurrent for triggering the SCR 10 into conduction. The gate terminal 14 of the SCR 10 is connected to a loading resistor 26. The other terminal of the loading resistor 26 is connected to the load 12 so as to be in series therewith.

Figure 1B:
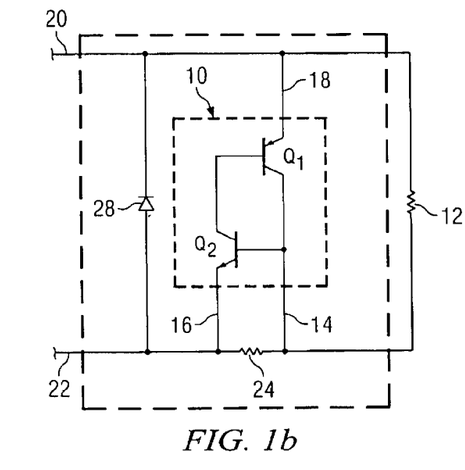
FIG. 1b is an electrical schematic drawing of a thyristor circuit coupled across a low impedance load, without the use of a loading resistor.

The operation of the thyristor circuit according to the invention is best understood by reference to FIG. 1b, where the loading resistor 26 is assumed for purposes of explanation to be replaced by a short circuit. As noted above, a feature of the invention is that the SCR 10 is arranged to protect the low-impedance load 12 from overcurrents. If not protected from overcurrents, the load could be damaged, depending on the magnitude of overcurrent and the length of time the overcurrent is applied to the circuit. A positive polarity current is assumed to be applied to the circuit conductor 20, which current passes through the load 12 and the bias resistor 24, and out of circuit conductor 22. As the current increases, the voltage across the bias resistor 24 increases. If the current exceeds a given threshold, the voltage across the bias resistor 24 exceeds the base-emitter junction turn-on voltage of transistor Q2. If the circuit conditions are satisfied to initiate and sustain regenerative action, then transistor Q1 is driven into conduction, as the collector current drawn by transistor Q2 will cause base current of transistor Q1 to flow. However, according to the well-known regenerative action of four-layer devices, the current gain $\alpha 1$ of transistor Q1 plus the current gain $\alpha 2$ of transistor Q2 must equal or exceed unity, namely, $\alpha 1 + \alpha 2 \geq 1.0$. It is also known that with smaller currents available to the thyristor, the current gains are correspondingly smaller.

In the circuit configuration of FIG. 1b, when the load impedance 12 is of a small value, most of the overcurrent passes through the load 12 and the bias resistor 24, and not through the thyristor device 10. As such, the thyristor 10 is not driven into a latched state, as transistor Q1 is not turned on. The base-emitter junction of transistor Q2 is fully turned on and saturated, but since transistor Q1 is off due to insufficient base-emitter voltage, the thyristor 10 is not driven into the latched condition to thereby protect the load 12 from overcurrents. In the event the overcurrent is of a sufficient duration and of a significant magnitude, the load 12 and bias resistor 24 could be damaged. If the overcurrent is of a significant magnitude and is not shunted around the load 12, the load component, or components, could generate enough heat to catch on fire, burst, or cause physical damage to surrounding components.

From the foregoing, it can be seen that thyristors have not been successfully employed for current protection devices with low impedance loads. In many instances involving low impedance loads, an additional impedance can be added without substantially compromising the function or efficiency of the circuit. Sometimes the addition of only a few ohms in series with the low impedance load will allow the reliable use of a thyristor device in parallel therewith to provide overcurrent protection at levels of less than one ampere to the load. While the example of FIG. 1a discloses the use of a resistor for the loading device, other types of load impedances may also be protected by thyristor circuits. When employed in connection with telephone lines and low inductance transformers, as is typically used in subscriber line interface circuits, the transformer resistance may be on the order of only one ohm, the bias resistor 24 may be about four ohms, and the loading resistor 26 may be about two ohms.

As noted above, the load 12 is protected from overcurrents flowing into the circuit conductor 20. Currents of the opposite polarity flowing in the other direction, namely into circuit conductor 22, are shunted around the load 12 by a diode 28. The diode 28 is useful when the thyristor overcurrent protection circuit of the invention is used with subscriber line interface circuits. Otherwise, the diode 28 is optional, and is not necessary if the circuit involving the load 12 either does not allow overcurrents to flow into the circuit conductor 22 to the load 12, or if such currents are otherwise limited elsewhere in the circuit. The diode 28 can be any conventional rectifier, or can be a pn junction formed in the chip with the SCR.

Figure 2:
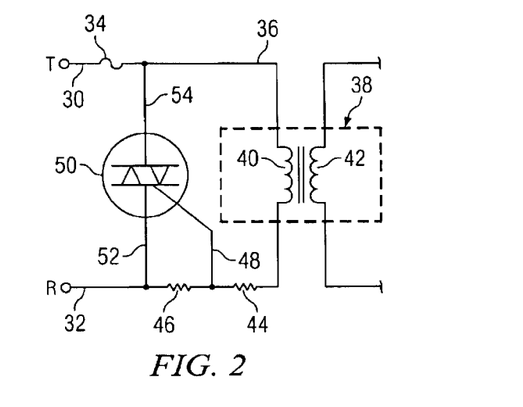
FIG. 2 is another embodiment of a thyristor circuit adapted for providing overcurrent protection to a transformer.

With reference now to FIG. 2 of the drawings, there is disclosed an embodiment of the invention adapted for protecting various components of a communication subscriber line circuit. In many communication circuits, miniature low inductance transformers are used to provide DC isolation, as well as to couple AC signals therethrough. Such type of transformers are generally packaged so as to be modular to provide a miniature component that has a small footprint with respect to the printed circuit to which it is mounted. As is well known, the DC resistance of miniature transformer windings can be very small, sometimes on the order of one ohm or less. Similarly, the transformers can be saturated at low energy levels, thereby resulting in a low impedance load. Communication lines, and especially those types that are exposed to environmental conditions, including lightning and power line crosses, can experience overcurrent conditions from time to time. A need thus exists for a simple thyristor circuit for protecting such type of loads from overcurrents.

The communication line includes a tip conductor 30 and a ring conductor 32. A fuse 34 is in series with the tip conductor 30. The fuse 34 functions to isolate the tip conductor 30 from the communication circuit conductor 36 in response to a sustained overcurrent. Instead of using a fuse, those skilled in the art may find that other components, such as a PTC device, are well adapted for protecting the transformer from large, sustained overcurrents. The circuit conductor 36 is typically connected to one terminal of the primary 40 of a transformer 38, as well as to the anode 54 of a thyristor 50. The other terminal of the transformer primary 40 is connected to a loading resistor 44, or other loading impedance. The loading resistor 44 is connected to both a bias resistor 46 and to the gate terminal 48 of the thyristor 50. The other terminal of the bias resistor 46 is connected to both the cathode terminal 52 of the thyristor 50 and the ring conductor 32 of the communication line. The secondary 42 of the transformer 38 is coupled to other components of the line circuit for processing voice signals, digital signals, DTMF and other signals. While the transformer 38 is shown as a component having a single primary and a single secondary, there are many different types of transformers that are used in communication circuits, all of which can be protected with the various embodiments of the invention.

In the embodiment of the thyristor circuit shown in FIG. 2, the thyristor 50 operates in a bidirectional manner to allow overcurrents of either polarity to pass therethrough when triggered into conduction. Such a thyristor can be constructed in the manner described in U.S. Pat. No. 6,407,901. In many AC circuits, the currents can be of either polarity, and thus the thyristor 50 will protect the load in either case. In practice, lightning strikes to a communication line, or power line crosses, may involve overcurrents of both polarities, and thus the bidirectional thyristor 50 is well adapted for protecting the transformer load against damage due to sustained overcurrents.

The thyristor device described in U.S. Pat. No. 6,407,901 provides overvoltage protection as well as overcurrent protection to a circuit connected thereto. Even when the load to be protected is characterized by a low impedance, overvoltage protection may nevertheless be desirable in situations where the load includes a fuse or other similar protection device, or where load includes a component that has been open circuited for some reason. In these situation, even though an overcurrent cannot flow into the open circuit, an overvoltage can still present safety concerns. By utilizing a device that has both overvoltage and overcurrent protection, the circuit bridged across the thyristor device is protected from both overvoltage and overcurrent conditions.

In operation, when the communication circuit functions in a conventional manner, the thyristor 50 is in the blocking state. Namely, communication and signaling currents pass through the fuse 34, the transformer primary 40, the loading resistor 44 and the bias resistor 46. The AC component of the signal is coupled via the transformer 38 to other processing circuits, not shown. Importantly, the bias resistor 46 is selected so as to be of a value such that normal AC or DC currents do not cause the thyristor 50 to be triggered into conduction. When used in connection with subscriber lines which carry up to 200 ma of current, the bias resistor 46 is selected to be of a value of about 4 ohms. The desired threshold for triggering the thyristor 50 into conduction depends on the value of the bias resistor 46, which is independent of the value of the loading resistor 44. In like manner, for the proper overcurrent protection of the transformer 38, the value of the loading resistor 44 is independent of the value of the bias resistor 46. The value of the loading resistor 44 is, however, dependent on the impedance of the transformer 38. The impedance of the transformer 38 plus the impedance of the loading resistor 44 should be sufficient so that the current through the thyristor 50 during initial turn-on allows α1+α2 to equal or exceed unity. It is anticipated that when using conventional thyristors and a transformer having a primary resistance of about 0.1 ohm, the value of the loading resistor 44 can be in the range of about one to two ohms. With this arrangement, the thyristor 50 reliably protects the transformer 38 against overcurrents exceeding about 200–250 ma. The fuse 34 will typically have an amperage rating such that the fusible link therein will melt when sustained overcurrents are encountered. With such an arrangement, the thyristor 50 functions as a high speed switch which will protect the load from transient overcurrents which are otherwise insufficient to melt the fuse 34, and will protect the load from sustained overcurrents until the fuse 34 melts. Depending on the power rating of the thyristor 50 employed, the device can provide protection to the transformer 38 in the absence of a fuse 34, or if the current is insufficient to blow the fuse 34.

The loading resistor 44 is shown connected in the bottom leg of the transformer primary 40. Alternatively, the loading resistor 44 can be connected in the top leg of the transformer primary 40. Essentially, the loading resistor 44 can be connected anywhere in the anode-gate circuit of the thyristor 50. Indeed, the loading resistor 44 can be integrated into the windings of the transformer 38 by using resistance wire for the transformer windings. In this event, the loading resistor 44 can be integrated into the transformer module without requiring another electrical component to be mounted to the printed circuit board, or the like. It may also be advantageous to mount the loading resistor 44, as a component, in the module into which the transformer 38 is packaged.

Figure 3:
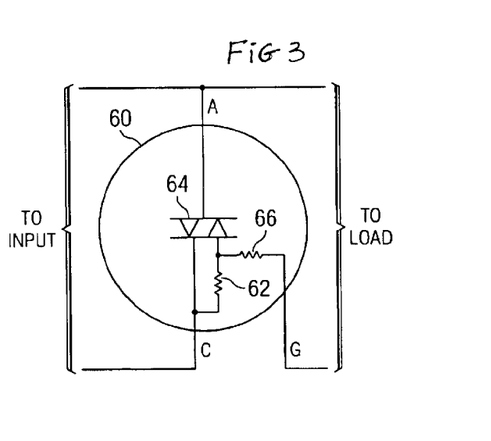
FIG. 3 symbolically illustrates a bidirectional thyristor having integrated therein the various resistors.

In accordance with another feature of the invention, the loading resistor 44 can be integrated into the thyristor 60 itself, as symbolically shown in FIG. 3. The thyristor 60 functions in a bidirectional manner to provide protection against overcurrents of either polarity. However, the integration of either or both of the resistors 44 or 46 can be accomplished in other types of thyristors, such as SCRs, triacs, three-terminal SIDACtors®, or other multilayer regenerative devices. In any event, the bias resistor 62 can be integrated in the semiconductor material with the device 64 in the manner as disclosed in U.S. Pat. No. 6,407,901. Similarly, the loading resistor 66 can also be integrated in the semiconductor material with the device 64. Because of the generally low resistance values of the resistors 62 and 66, the formation thereof by appropriate doping of the semiconductor material is easily carried out. It is possible that resistors of several values can be formed in the semiconductor material, and one selected during processing to allow the thyristor 60 to, for example, respond to a desired overcurrent threshold. In other words, a number of bias resistors 62 can be formed in the semiconductor material, either individually or through resistor taps, and one selected during processing so that the thyristor is triggered into conduction at the associated overcurrent threshold. Similarly, the loading resistor 66 can be formed as several resistors and one selected during processing so that when placed in series with a load, it is assured that the thyristor will be placed in the regenerative mode.

The embodiment of FIG. 3 provides the advantage of using a single component coupled in parallel with a low impedance load to provide reliable overcurrent protection thereto. In addition, when the thyristor 60 is constructed in accordance with that disclosed in the U.S. Pat. No. 6,407,901, overvoltage protection is also provided to the load, independent of any overcurrent conditions. In the absence of either an overvoltage or an overcurrent, the device 64 is in a blocking state, and normal circuit current flows through both resistors 62 and 66 in series with the load component(s).

Figure 4A:
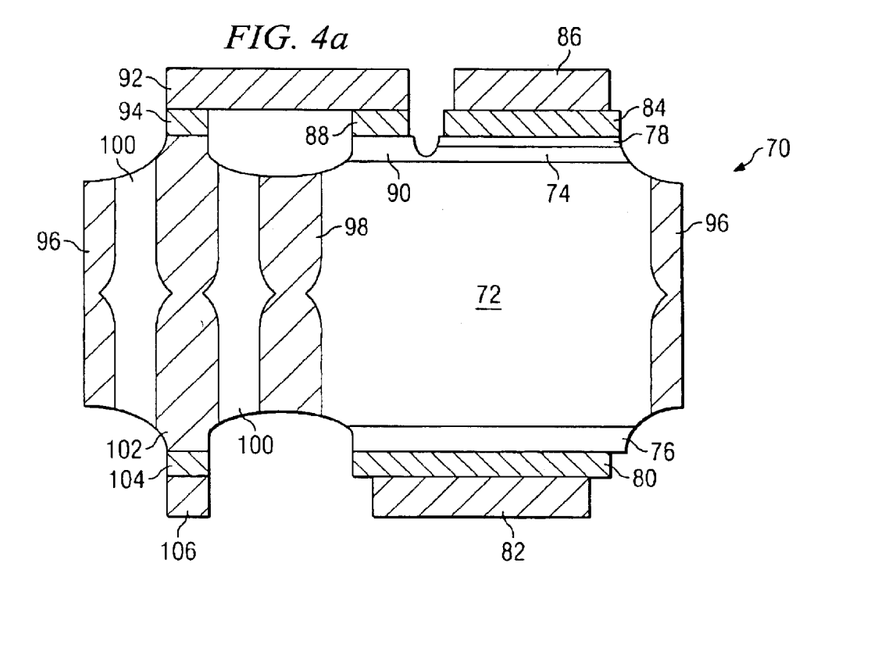
FIGS. 4a and 4b are respective side cross-sectional and top views of one embodiment of a semiconductor chip embodying the principles and concepts of the invention.
Figure 4B:
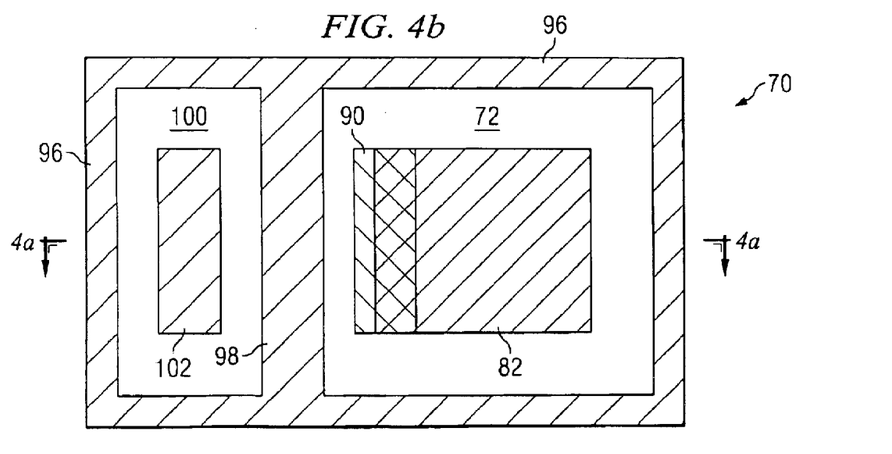

FIGS. 4a and 4b illustrate a thyristor 70 of a conventional design, but with the loading resistor integrated in the semiconductor material according to one embodiment of the invention. Preferably, the thyristor 70 is constructed with a lightly doped n-type mid-region 72. An upper p-type base region 74 and a lower p-type base region 76 are formed in the mid-region 72. An n-type emitter region 78 is formed in the upper base region 74. A lower n-type emitter region (not shown) is formed in the lower base region 76. While not shown, the thyristor 70 may include n-type buried regions formed between the respective base regions 74 and 76 and the mid-region 72, and doped to a desired concentration level to establish a specified breakover voltage to the thyristor 70. The breakover voltage is the threshold voltage where the thyristor 70 is driven into conduction to protect the load from overvoltages. The thyristor 70 is triggered into conduction by an overvoltage coupled across the anode and cathode terminals, all independent of any gate voltage applied to the device. In addition, the emitter regions can be formed with shorting dots to control the magnitude of current that flows in the device before turn-on. To that end, this structure forms the bias resistor 62 shown in FIG. 3.

Formed on the lower base region 76 and the lower emitter region (not shown) is an anode metallization 80, commonly called the MT2 terminal. A metal lead frame portion 82 is soldered or otherwise bonded to the anode metallization 80. Similarly, a cathode metallization 84 is formed in contact with the upper emitter region 78 and the upper base region 74. The upper base region 74 extends to the left in FIG. 4a and is covered with a metallization 88. A portion of the upper base region 90 covered by the metallization 88 contributes to the bias resistor 62 shown in FIG. 3. The thickness, lateral area and the doping concentration of the portion of the base region 90 define the resistance of the semiconductor bias resistor 62 of FIG. 3. A gate interconnect lead frame 92 provides an interconnect between the metallizations 88 and 94. It is understood that the metallizations 84, 88 and 94 can be formed at the same time in the process, but patterned to define the individual interconnects.

Formed in the mid-region 72 is a perimeter diffusion 96 that is heavily doped with a p-type impurity. The perimeter diffusion 96 functions as an isolation, i.e., as a pn junction with the mid-region 72. The perimeter diffusion 96 is formed by masking both sides of the semiconductor chip, implanting the openings in the mask with a high concentration of a p-type impurity, and then driving the impurity into the chip by a high temperature drive until the impurity meets and overlaps in the center of the chip. Depending on the type of impurity employed, the high temperature drive may take five days or more. Formed at the same time and by the same process as the perimeter diffusion 96, is a neutral zone 98 that interconnects opposite sides of the perimeter diffusion 96. This forms an isolated area of the n-type mid-region 72, which is essentially an isolated tank 100 of n-type material. Formed in the isolated tank 100 of n-type material is a p+ conductive pillar 102 that extends from one side of the chip to the opposite side. The conductive pillar 102 is formed at the same time and in the same manner as both the peripheral diffusion 96 and the neutral zone 98. The conductive pillar 102 forms either the loading resistor 44 shown in FIG. 2, or the loading resistor 66 of FIG. 3.

In accordance with an important feature of the invention, the conductive pillar 102 functions as the loading resistor 66 of FIG. 3. The cross-sectional area, length and doping concentration define the resistance of the conductive pillar 102, and thus the resistance of the loading resistor 66. The bottom end of the conductive pillar 102 is metallized with a metal 104. Soldered or otherwise bonded to the metal 104 is a gate lead frame portion 106. The conductive pillar 102 is in series between the gate terminal 106 and the semiconductor gate region 90. As can also be appreciated, the resistance of the bias resistor of the gate region 90 can be made independent of the resistance of the loading resistor defined by the conductive pillar 102.

It should be noted that the curved portions of the chip are formed by appropriate etching steps to remove selected portions of the semiconductor material. Not shown is the passivation material that is typically used to provide environmental protection to the semiconductor chip.

Figure 5A:
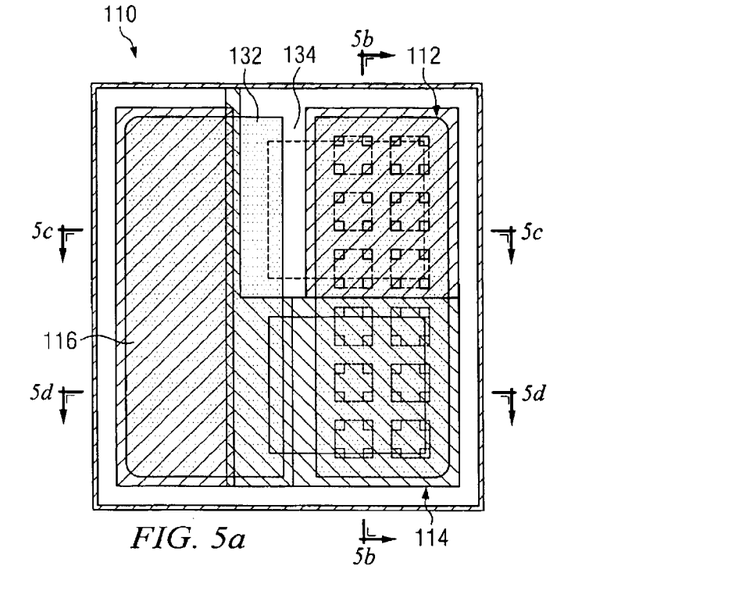
FIG. 5a is a top view of a semiconductor chip having formed therein a bidirectional thyristor, together with various resistors according to the invention.

FIGS. 5a–5d illustrate another embodiment of the invention as incorporated into a semiconductor chip. FIG. 5a is a top view of the semiconductor chip 110 which shows on the right a first unidirectional thyristor 112 and a second unidirectional thyristor 114. The thyristors 112 and 114 are structured to carry positive and negative currents respectively. In other words, when the overcurrents are of the AC type, the thyristors 112 and 114 will conduct alternately.

The current carrying resistive pillar 116 is cross-sectionally large to reduce the resistance and to increase the current carrying capability of the structure. In a preferred form of the invention, the loading resistor defined by the resistive pillar 116 has a resistance of about 1 ohm. This low resistance is well adapted for use in protecting many physically small communication line transformer loads. In practice, the semiconductor chip is about ten mils thick, and the resistive pillar 116 has a cross-sectional area of several hundred square mils, with a suitable doping concentration. This can produce a resistance in series with the gate terminal of about 1 ohm.

Figure 5B:
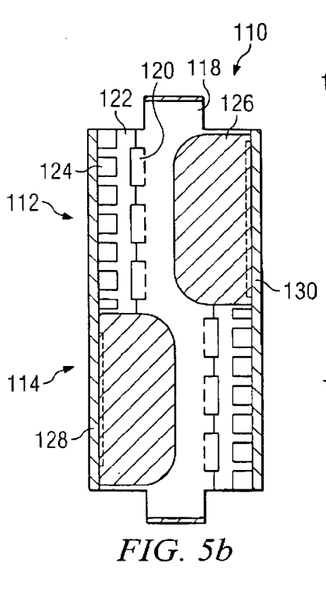
FIG. 5b is a cross-sectional view of the semiconductor chip of FIG. 5a, taken along line 5b—5b.
Figure 5C:
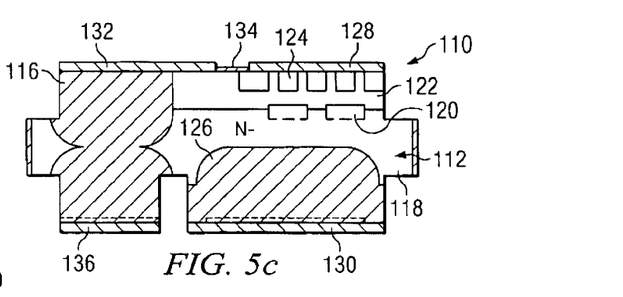
FIG. 5c is a cross-sectional view of the semiconductor chip of FIG. 5a, taken along line 5c—5c.
Figure 5D:
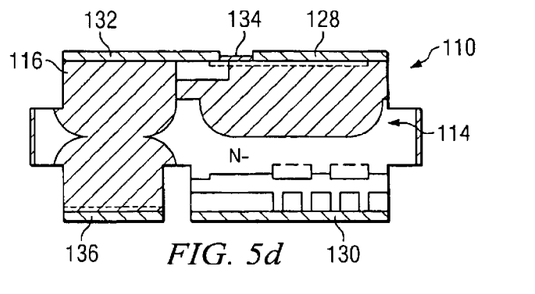
FIG. 5d is a cross-sectional view of the semiconductor chip of FIG. 5a, taken along line 5d—5d.

With reference to FIG. 5b, there is shown a cross-sectional view of the two thyristors 112 and 114. The thyristors 112 and 114 are constructed using a lightly doped n-type mid-region 118. The first thyristor 112 is formed in the mid-region 118 by forming a number of buried regions 120 between an upper p-type base region 122 and the mid-region 118. Formed in the upper base region 122 is an n-type emitter 124. The emitter 124 has formed therein plural shorting dots of the type well known in the art. An n-type lower emitter 126 forms the bottom portion of the first thyristor 112. The second thyristor 114 is formed at the same time as the first thyristor 112, and is formed in substantially the same manner, but to carry current in the opposite direction through the semiconductor chip.

A metal cathode contact 128 is formed over the top surface of the semiconductor chip, and a metal anode contact 130 is formed on the bottom surface of the chip. The semiconductor chip is passivated with an insulating glass or other passivation material, not shown.

A metal edge gate contact 132 is formed over the top portion of the resistive pillar 116. The right edge of the edge gate contact 132 is laterally spaced from the left edge of the metal cathode contact 128. An electrical insulation 134, such as silicon oxide, is formed between the spaced-apart edges of the edge gate contact 132 and the cathode contact 128. The semiconductor regions underlying the cathode contact 128 generally relate to the function of the device providing overvoltage protection, i.e., the primary function of a two-terminal SIDACtor® overvoltage protection device. The semiconductor regions underlying the edge gate contact 132 generally relate to the gating function to trigger the overvoltage protection portion of the device into conduction in response to an overcurrent condition.

The edge gate contact 132 is formed in contact with the top surface of the resistive pillar 116. A metal gate contact 136 is formed in contact with the bottom surface of the resistive pillar 116. Accordingly, the resistive pillar 116 is in series with the gate semiconductor structures, much like that shown in FIG. 3. The bias resistance for providing a forward bias to the gate-cathode junctions is formed as part of the semiconductor regions and features located between the respective emitter regions and the edge gate structure.

While the foregoing embodiments of the invention have been described in connection with the use of a loading resistor to add a resistance to the load, those skilled in the art may find that in certain situations, the loading impedance may comprise inductance, capacitance, or a combination of the same, with or without resistance.

Figure 6:
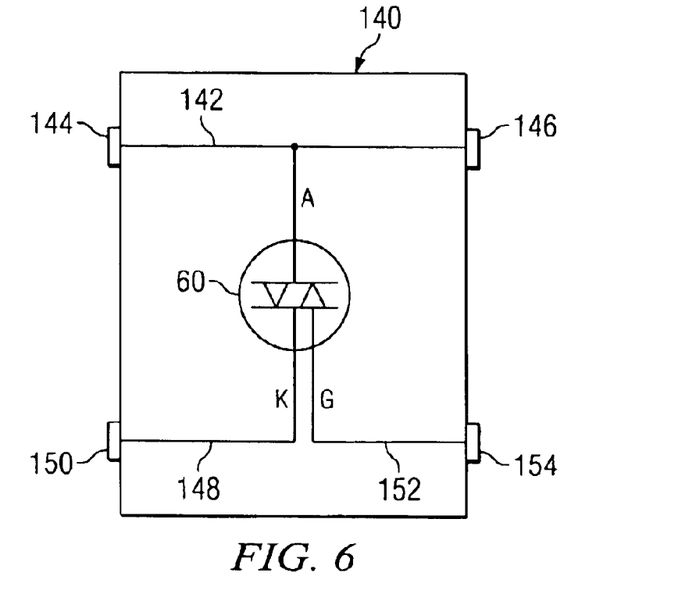
FIG. 6 is an outline of a four-pin package for housing the integrated circuit of an embodiment of the invention.
Figure 7:
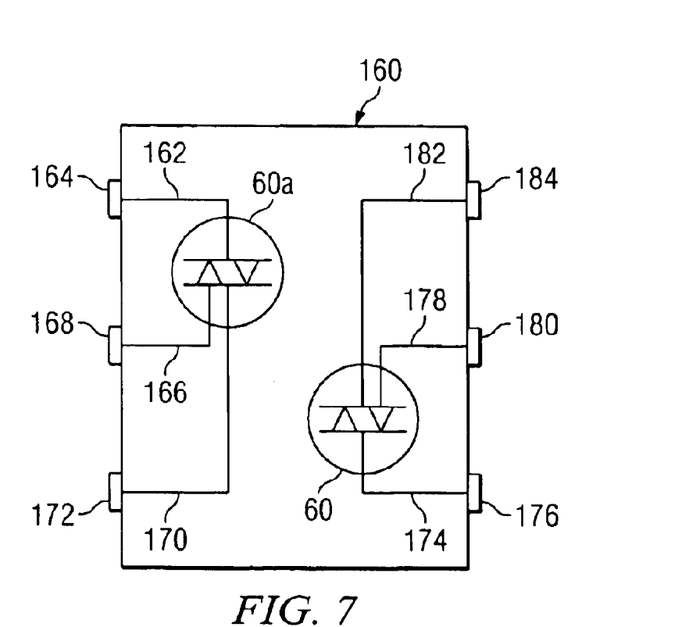
FIG. 7 is an outline of a six-pin package for housing the integrated circuit according to an embodiment of the invention.

In accordance with an embodiment of the invention, the thyristor circuit can be packaged in various ways, two of which are shown in FIGS. 6 and 7. In FIG. 6, the thyristor 60 described above in connection with FIG. 3 can be packaged in a four-pin package 140. The anode terminal 142 of the thyristor 60 can be connected to a pair of pins 144 and 146 of the package 140. Alternatively, the anode terminal 142 can be connected to only one pin of the package 140. The cathode terminal 148 is shown connected to pin 150 of the package. Lastly, the gate terminal 152 of the thyristor 60 is connected to the pin 154 of the package 140. This arrangement allows easy implementation of the thyristor package 140 in a printed circuit board.

FIG. 7 illustrates a six-pin package 160 that houses two thyristors 60a and 60b. The thyristor 60a has an anode terminal 162 connected to a pin 164 of the package 160. The gate terminal 166 of thyristor 60a is connected to pin 168, and the cathode terminal 170 is connected to pin 172. The companion thyristor 60b is similarly connected to three other pins of the package 160. In particular, the anode terminal 174 is connected to pin 176, the gate terminal 178 is connected to pin 180 and the cathode terminal 182 is connected to pin 184.

While the present invention has been described above in connection with various embodiments, it is to be understood that the disclosure has been made by way of example only, as many changes in detail and structure may be made to the invention without departing from the spirit and scope of the invention, as defined by the appended claims.

What is claimed is:

1. A thyristor circuit for use with a low impedance load, comprising:
   a gated thyristor having an anode, a cathode and a gate;
   a loading impedance for connection in series with said low impedance load;
   said anode and gate of said gated thyristor adapted for connection in parallel across said low impedance load and said loading impedance; and
   said anode and said cathode forming terminals for said thyristor circuit, whereby when a current exceeding a predefined magnitude passes through said low impedance load, said gated thyristor is gated on and current is shunted around said low impedance load.

2. The thyristor circuit of claim 1, further including a resistor coupled between said gate and cathode of said gated thyristor, said resistor functioning to provide a voltage across a gate-cathode junction of said gated thyristor.

3. The thyristor circuit of claim 1, wherein said gated thyristor comprises a triac.

4. The thyristor circuit of claim 1, wherein said low impedance load comprises a transformer winding.

5. The thyristor circuit of claim 1, wherein said gated thyristor comprises an SCR.

6. The thyristor circuit of claim 1, wherein said loading impedance comprises a resistor.

7. The thyristor circuit of claim 6, wherein said resistor comprises a discrete resistor component.

8. The thyristor circuit of claim 1, wherein said loading impedance is formed in semiconductor material with said gated thyristor.

9. The thyristor circuit of claim 1, wherein said gated thyristor is constructed such that an overvoltage applied across said cathode and anode triggers said gated thyristor on to protect said low impedance load from sustained voltages exceeding a predefined threshold.

10. The thyristor circuit of claim 1, wherein said loading impedance functions to increase the impedance coupled across said gated thyristor.

11. The thyristor circuit of claim 1, further including a rectifier coupled across the anode and cathode of said gated thyristor, said rectifier functioning to shunt current of a specified polarity around said low impedance load.

12. The thyristor circuit of claim 1, wherein said gated thyristor device is constructed to respond to an overvoltage exceeding a threshold, where said overvoltage is coupled between the cathode and anode.

13. The thyristor circuit of claim 1, further including in combination the low impedance load.

14. A thyristor circuit for use with a transformer load, comprising:
a first resistor adapted for connection in series with said transformer load to provide an additional resistance external to said transformer load;
a gated thyristor having an anode, cathode and gate, said anode and said gate adapted for connection in parallel across said first resistor and the transformer load; and
a second resistor connected between said gate and cathode of said gated thyristor, said second resistor functioning to establish an overcurrent threshold for said thyristor circuit, whereby said gated thyristor is triggered into conduction when said overcurrent threshold is exceeded to thereby prevent the overcurrent from passing through the transformer load.

15. The thyristor circuit of claim 14, wherein said first and said second resistors are integrally formed in semiconductor material with said gated thyristor.

16. The thyristor circuit of claim 15, wherein said first resistor is formed from one surface of a semiconductor chip to an opposite surface thereof.

17. The thyristor circuit of claim 14, further including in combination a telephone line having one conductor coupled to a fuse, and said fuse connected to the transformer load, and a second conductor of said telephone line coupled to the cathode of said gated thyristor.

18. The thyristor circuit of claim 14, wherein said first resistor has a resistance in the range of about 1–5 ohms.

19. The thyristor circuit of claim 14, wherein said gated thyristor is constructed to respond to an overvoltage exceeding a predefined magnitude coupled between the cathode and anode.

20. A thyristor circuit for use with a transformer defining a load, comprising:
said transformer packaged as a modular component, said transformer having a first winding inductively coupled to a second winding;
a first resistor connected in series with the first winding of said transformer to provide an additional resistance to said first winding, said first resistor packaged with said transformer so as to be a unitary modular component;
a gated thyristor having an anode, cathode and gate, said anode and said gate adapted for connection in parallel across said first resistor and said first winding; and
a second resistor connected between said gate and said cathode of said gated thyristor, said second resistor functioning to establish an overcurrent threshold for said thyristor circuit, whereby said gated thyristor is triggered into conduction when said overcurrent threshold is exceeded to thereby prevent the overcurrent from passing through the transformer load.

21. The thyristor circuit of claim 20, wherein said first resistor comprises a discrete resistor.

22. The thyristor circuit of claim 20, wherein said first resistor comprises a resistance formed in a wire forming the first winding.

23. A method of using a gated thyristor to protect a low impedance load from overcurrent conditions, comprising the steps of:
adding a resistance in series with the low impedance load to increase a composite impedance thereof;
coupling an anode terminal and a gate terminal of a gated thyristor across the series-connected low impedance load and resistance;
causing the gated thyristor to be driven to a latched state when a current exceeding a threshold passes through the low impedance load; and
causing the current through the latched gated thyristor to be coupled between the anode terminal and a cathode terminal of the latched gated thyristor, thereby routing overcurrents around the low impedance load.

24. The method of claim 23, further including using a thyristor having a resistance incorporated therein, and adding the resistance in series with the low impedance load by connecting the thyristor across the low impedance load.

25. The method of claim 23, further including using a bias resistance between the gate terminal and the cathode terminal to establish said threshold.

26. The method of claim 25, further including using a bias resistance incorporated in said gated thyristor.

* * * * *